(12) United States Patent
Hsu et al.

(10) Patent No.: US 11,050,021 B2
(45) Date of Patent: Jun. 29, 2021

(54) METHOD FOR MANUFACTURING RESISTIVE RANDOM ACCESS MEMORY STRUCTURE

(71) Applicant: Taiwan Semiconductor Manufacturing Co., Ltd, Hsinchu (TW)

(72) Inventors: Chern-Yow Hsu, Chu-Bei (TW); Fu-Ting Sung, Taoyuan (TW); Shih-Chang Liu, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/678,538

(22) Filed: Nov. 8, 2019

(65) Prior Publication Data
US 2020/0075856 A1 Mar. 5, 2020

Related U.S. Application Data

(62) Division of application No. 14/610,691, filed on Jan. 30, 2015, now Pat. No. 10,475,998.

(51) Int. Cl.
*H01L 45/00* (2006.01)
*H01L 27/24* (2006.01)

(52) U.S. Cl.
CPC ...... *H01L 45/1253* (2013.01); *H01L 27/2436* (2013.01); *H01L 27/2463* (2013.01); *H01L 45/04* (2013.01); *H01L 45/1233* (2013.01); *H01L 45/145* (2013.01); *H01L 45/146* (2013.01); *H01L 45/147* (2013.01); *H01L 45/1675* (2013.01)

(58) Field of Classification Search
CPC . H01L 45/1233; H01L 45/1253; H01L 45/16; H01L 45/1675
See application file for complete search history.

(56) References Cited

U.S. PATENT DOCUMENTS

| | | | |
|---|---|---|---|
| 6,418,049 B1 | 7/2002 | Kozicki et al. | |
| 7,983,065 B2 | 7/2011 | Samachisa | |
| 7,995,374 B2 | 8/2011 | Komura et al. | |
| 8,325,507 B2 | 12/2012 | Yang et al. | |
| 8,742,390 B1 | 6/2014 | Tu et al. | |
| 9,293,701 B2 | 3/2016 | Choi et al. | |
| 9,627,616 B2 | 4/2017 | Kim et al. | |
| 10,475,998 B2 * | 11/2019 | Hsu | H01L 45/04 |

(Continued)

*Primary Examiner* — Mark V Prenty
(74) *Attorney, Agent, or Firm* — Birch, Stewart, Kolasch & Birch, LLP

(57) ABSTRACT

A semiconductor structure and a method for forming the same are provided. The method for manufacturing a semiconductor structure includes forming a bottom electrode layer over a substrate and forming a dielectric layer over the bottom electrode layer. The method for manufacturing a semiconductor structure further includes forming a top electrode layer over the dielectric layer and patterning the bottom electrode layer, the dielectric layer, and the top electrode layer to form a dielectric structure between a bottom electrode and a top electrode. The method for manufacturing a semiconductor structure further includes etching the bottom electrode from a sidewall of the bottom electrode to partially expose a bottom surface of the dielectric structure.

19 Claims, 6 Drawing Sheets

(56) References Cited

U.S. PATENT DOCUMENTS

| | | |
|---|---|---|
| 2014/0021584 A1 | 1/2014 | Tu et al. |
| 2014/0166961 A1 | 6/2014 | Liao et al. |
| 2014/0252295 A1 | 9/2014 | Liao et al. |
| 2014/0264222 A1 | 9/2014 | Yang et al. |

* cited by examiner

METHOD FOR MANUFACTURING RESISTIVE RANDOM ACCESS MEMORY STRUCTURE

PRIORITY CLAIM AND CROSS-REFERENCE

This application is a Divisional application of U.S. patent application Ser. No. 14/610,691, filed on Jan. 30, 2015, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Over the past several decades, the semiconductor integrated circuit industry has experienced rapid growth. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

In integrated circuit devices, resistive random access memory (RRAM) is an emerging technology for next-generation non-volatile memory devices. RRAM is a memory structure including an array of RRAM cells each of which stores a bit of data using resistance values, rather than an electronic charge. However, although existing processes for manufacturing RRAM have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
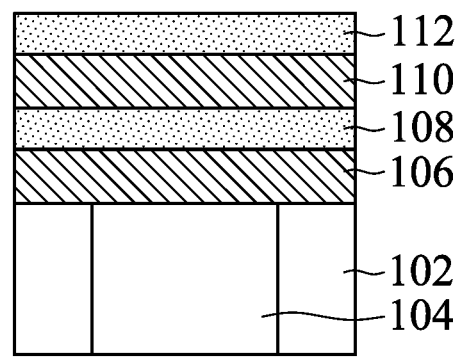
FIGS. 1A to 1E are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided in accordance with some embodiments of the disclosure. The semiconductor structure may include a resistive random access memory (RRAM) structure, and the resistive random access memory structure may include a top electrode, a bottom electrode, and a dielectric structure formed between the top electrode and the bottom electrode. In addition, in the processes for manufacturing the resistive random access memory structure, a pull-back etching process is performed to etch the top electrode and the bottom electrode but not the dielectric structure, such that the width of the dielectric structure is greater than the width of the top electrode and the bottom electrode.

FIGS. 1A to 1E are cross-sectional representations of various stages of forming a semiconductor structure 100a in accordance with some embodiments. As shown in FIG. 1A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, conductive features, and/or isolation structures. Furthermore, substrate 102 may further include single or multiple material layers to be patterned. For example, the material layers may include a silicon layer, a dielectric layer, and/or a doped poly-silicon layer.

In some embodiments, substrate 102 includes a device region 104, as shown in FIG. 1A. Device region 104 may include active components or circuits, such as conductive features, implantation regions, resistors, capacitors, and other semiconductor elements. In some embodiments, device region 104 includes a memory cell transistor and an interconnect structure.

A bottom electrode layer 106 is formed over substrate 102, and a dielectric layer 108 is formed over bottom electrode layer 106, as shown in FIG. 1A in accordance with some embodiments. In some embodiments, bottom electrode layer 106 is made of TiN, TaN, Ti, Ta, gold (Au), platinum (Pt), ruthenium (Ru), iridium (Ir), titanium (Ti), aluminum (Al), copper (Cu), tantalum (Ta), tungsten (W), iridium-tantalum alloy (IrTa), indium-tin oxide (ITO), or combinations thereof. Bottom electrode layer 106 may be formed by deposition processes, such as a chemical vapor deposition (CVD) process, a physical vapor deposition (PVD) process, an atomic layer deposition (ALD) process, a high density plasma CVD (HDPCVD) process, a metal organic CVD (MOCVD) process, or a plasma enhanced CVD (PECVD) process.

In some embodiments, dielectric layer 108 is made of a high-k dielectric material. Examples of the high k dielectric material may include, but are not limited to, zirconium dioxide ($ZrO_2$), aluminum oxide ($Al_2O_3$), hafnium oxide ($HfO_2$), tantalum oxide ($Ta_2O_5$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, silicon oxide, silicon nitride, silicon oxynitride, titanium oxide, or hafnium dioxide-alumina ($HfO_2$-$Al_2O_3$) alloy. Dielectric layer 108 may be formed by deposition processes, such as a chemical vapor deposition process, a physical vapor deposition process, an atomic layer deposition process, a high density plasma CVD process, a metal organic CVD process, or a plasma enhanced CVD process.

After dielectric layer 108 is formed, a top electrode layer 110 is formed over dielectric layer 108, and a hard mask layer 112 is formed over top electrode layer 110, as shown in FIG. 1A in accordance with some embodiments. In some embodiments, top electrode layer 110 is made of TiN, TaN, Ti, Ta, gold (Au), platinum (Pt), ruthenium (Ru), iridium (Ir), titanium (Ti), aluminum (Al), copper (Cu), tantalum (Ta), tungsten (W), iridium-tantalum alloy (IrTa), indium-tin oxide (ITO), or combinations thereof. In some embodiments, top electrode layer 110 and bottom electrode layer 106 are made of the same conductive material. In some embodiments, top electrode layer 110 and bottom electrode layer 106 are made of different conductive materials.

Top electrode layer 110 may be formed by deposition processes, such as a chemical vapor deposition process, a physical vapor deposition process, an atomic layer deposition process, a high density plasma CVD process, a metal organic CVD process, or a plasma enhanced CVD process.

In some embodiments, hard mask layer 112 is made of silicon oxide ($SiO_2$), silicon nitride (SiN), silicon oxynitride (SiON), silicon carbide (SiC), silicon oxycarbide (SiOC), or a combination thereof. Hard mask layer 112 may be formed by performing a low-pressure chemical vapor deposition (LPCVD) process or a plasma enhanced chemical vapor deposition (PECVD) process, although other deposition processes may also be used in some other embodiments.

Figure 1B:
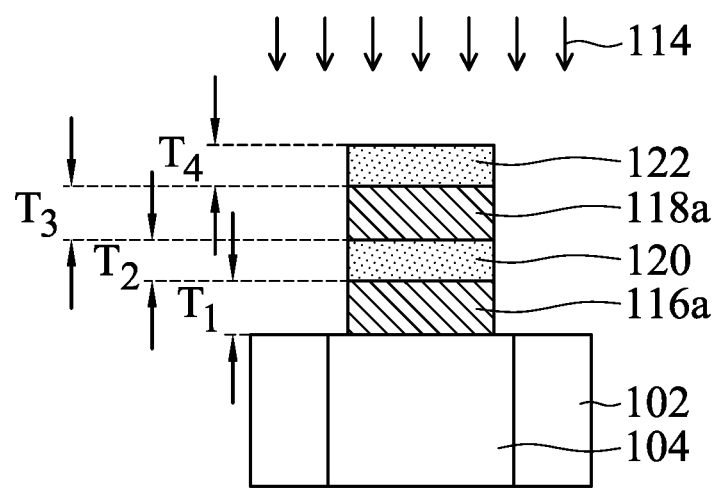

After bottom electrode layer 106, dielectric layer 108, top electrode layer 110, and hard mask layer 112 are formed, an etching process 114 is performed to pattern these layers, as shown in FIG. 1B in accordance with some embodiments. More specifically, hard mask layer 112, top electrode layer 110, dielectric layer 108, and bottom electrode layer 106 are patterned by a one-step cutting process. That is, hard mask layer 112, top electrode layer 110, dielectric layer 108, and bottom electrode layer 106 are patterned to have the same pattern by using the same photoresist structure (not shown) during the same etching process 114. Therefore, no complicated masking and aligning processes are required.

During etching process 114, bottom electrode layer 106 is patterned to form a bottom electrode 116a, and top electrode layer 110 is patterned to form a top electrode 118a, as shown in FIG. 1B in accordance with some embodiments. In addition, a dielectric structure 120 is formed between bottom electrode 116a and top electrode 118a, and a hard mask structure 122 is formed over top electrode 118a. Since bottom electrode 116a, dielectric structure 120, top electrode 118a, and hard mask structure 122 are formed by the same etching process 114, they all have the same width after etching process 114, as shown in FIG. 1B.

In some embodiments, bottom electrode 116a has a first thickness Ti in a range from about 5 nm to about 40 nm. The thickness of bottom electrode 116a is designed to have an applicable resistance and electrical function. For example, if first thickness $T_1$ of bottom electrode 116a is too thin, it may tend to be damaged by the high voltage applied thereto.

In some embodiments, dielectric structure 120 has a second thickness $T_2$ in a range from about 3 nm to about 15 nm. The thickness of dielectric structure 120 is designed to have an applicable resistance and electrical function. Therefore, if second thickness $T_2$ of dielectric structure 120 is too thick, the resistance of dielectric structure 120 may be too high. On the other hand, if second thickness $T_2$ of dielectric structure 120 is too thin, it may tend to be damaged by the high voltage applied thereto.

In some embodiments, top electrode 118a has a third thickness $T_3$ in a range from about 5 nm to about 40 nm. Similarly, the thickness of top electrode 118a is designed to have an applicable resistance and electrical function. For example, if third thickness $T_3$ of top electrode 118a is too thin, it may tend to be damaged by the high voltage applied thereto.

In some embodiments, hard mask structure 122 has a fourth thickness $T_4$ in a range from about 5 nm to about 40 nm. Hard mask structure 122 is configured to be a mask layer when bottom electrode layer 106, dielectric layer 108, and top electrode layer 110 are patterned. Therefore, hard mask structure 122 should be thick enough so that some portions of bottom electrode 116a, dielectric structure 120, and top electrode 118a can be protected during etching process 114 to have the pattern as designed.

Figure 1C:
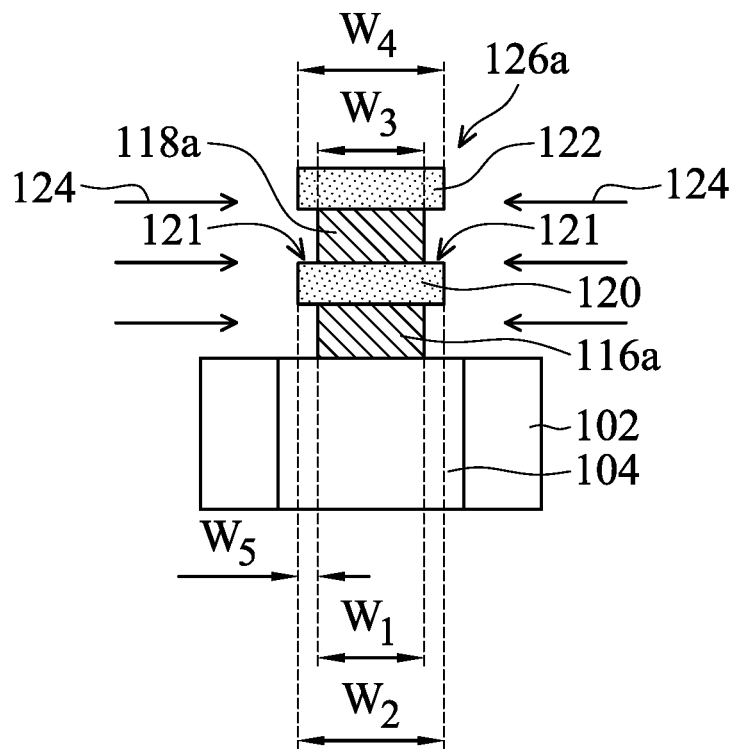

After etching process 114 is performed, a pull-back etching process 124 is performed to etch top electrode 118a and bottom electrode 116a, as shown in FIG. 1C in accordance with some embodiments. During pull-back etching process 124, top electrode 118a and bottom electrode 116a are etched from their sidewalls, while dielectric structure 120 and hard mask structure 122 are not etched. In some embodiments, pull-back etching process 124 is a wet etching process. In some embodiments, pull-back etching process 124 includes using a mixture of $NH_3$, $H_2O_2$, and $H_2O$, such that only top electrode 118a and bottom electrode 116a are etched during pull-back etching process 124 but dielectric structure 120 and hard mask structure 122 are not.

In some embodiments, pull-back etching process 124 is performed at a temperature in a range from about 15° C. to about 80° C. The etching rate for etching bottom electrode 116a and top electrode 118a may be adjusted by changing the temperature. Therefore, the resulting size of bottom electrode 116a and top electrode 118a may be adjusted by the temperature. If the temperature for performing pull-back etching process 124 is too high, the etching rate for etching bottom electrode 116a and top electrode 118a may be too high, such that too much of bottom electrode 116a and top electrode 118a is removed. On the other hand, if the temperature for performing pull-back etching process 124 is too low, the etching rate for etching bottom electrode 116a and top electrode 118a may not be high enough to etch the appropriate amount of bottom electrode 116a and top electrode 118a.

As shown in FIG. 1C, a resistive random access memory structure 126a is formed, and resistive random access memory structure 126a includes bottom electrode 116a, dielectric structure 120, and top electrode 118a. In addition, hard mask structure 122 is formed over top electrode 118a. Hard mask structure may be used not only for patterning top electrode layer 110, dielectric layer 108, and bottom electrode layer 106 but also for protecting top electrode 118a during subsequent processes.

Furthermore, since top electrode 118a and bottom electrode 116a are etched during pull-back etching process 124 but dielectric structure 120 and hard mask structure 122 are not, the widths of top electrode 118a and bottom electrode 116a are diminished but the widths of dielectric structure 120 and hard mask structure 122 remain the same after pull-back etching process 124. As a result, dielectric structure 120 has an extending portion 121 extending from top electrode 118a and bottom electrode 116a.

In some embodiments, bottom electrode 116a has a first width $W_1$, and dielectric structure 120 has a second width $W_2$ which is greater than the first width $W_1$. In addition, top electrode 118a has a third width $W_3$, and hard mask structure 122 has a fourth width $W_4$ which is substantially equal to the second width $W_2$ and is greater than the third width $W_3$. Furthermore, in some embodiments, the second width $W_2$ is greater than the third width $W_3$. Accordingly, extending portion 121 extrudes from top electrode 118a and bottom electrode 116a, as shown in FIG. 1C. In some embodiments, extending portion 121 of dielectric structure 120 has a fifth width $W_5$, which can be defined as the distance between an edge of dielectric structure 120 and an edge of top electrode 118a. In some embodiments, the fifth width $W_5$ of extending portion 121 is in a range from about 1 nm to about 5 nm.

In some embodiments, bottom electrode 116a and top electrode 118a are made of the same, or similar, material and have the same, or similar, etching rate during pull-back etching process 124. Therefore, the first width $W_1$ of bottom electrode 116a is substantially equal to the third width $W_3$ of top electrode 118a in accordance with some embodiments. However, in some other embodiments, bottom electrode 116a and top electrode 118a may be made of different materials and may have different etching rate during pull-back etching process 124 (the details will be described later).

In some embodiments, the difference between the second width $W_2$ of dielectric structure 120 and the first width $W_1$ of bottom electrode 116a is in a range from about 1 nm to about 5 nm. If the difference between the second width $W_2$ of dielectric structure 120 and the first width $W_1$ of bottom electrode 116a is too large, the resistance of bottom electrode 116a may increase. On the other hand, if the difference between the second width $W_2$ of dielectric structure 120 and the first width $W_1$ of bottom electrode 116a is too small, the risk of a short circuit increases.

In some embodiments, the difference between the second width $W_2$ of dielectric structure 120 and the third width $W_3$ of top electrode 118a is in a range from about 1 nm to about 5 nm. Similarly, if the difference between the second width $W_2$ of dielectric structure 120 and the third width $W_3$ of top electrode 118a is too large, the resistance of top electrode 118a may increase. On the other hand, if the difference between the second width $W_2$ of dielectric structure 120 and the third width $W_3$ of top electrode 118a is too small, the risk of a short circuit increases.

Figure 1D:
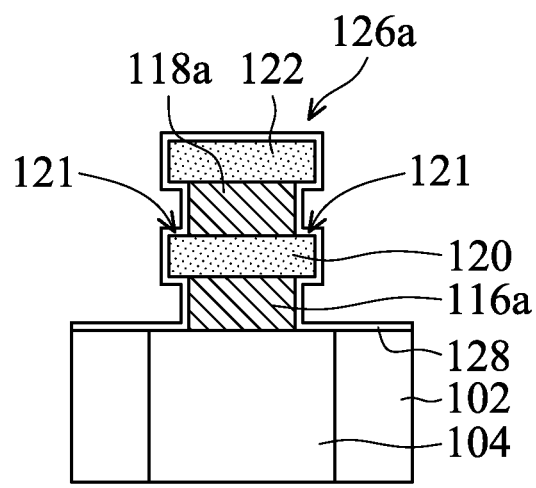

After pull-back etching process 124 is performed, an etch stop layer 128 is conformally formed to cover resistive random access memory structure 126a, as shown in FIG. 1D in accordance with some embodiments. In some embodiments, etch stop layer 128 is made of silicon nitride (SiN), silicon oxynitride (SiON), silicon carbide (SiC), or a combination thereof. Etch stop layer 128 is formed by an atomic layer deposition (ALD) process. As described above, top electrode 118a and bottom electrode 116a are etched during pull-back etching process 124. Therefore resistive random access memory structure 126a has bumpy sidewalls, and conformally forming a material layer on the bumpy sidewall by deposition processes such as CVD may be difficult. Accordingly, an atomic layer deposition process may be used to form etch stop layer 128, such that etch stop layer 128 can be conformal to the profile of resistive random access memory structure 126a.

As shown in FIG. 1D, etch stop layer 128 is formed over the top surface of hard mask structure 122 and over the sidewalls of hard mask structure 122, top electrode 118a, dielectric structure 120, and bottom electrode 116a. In addition, etch stop layer 128 further covers the top surface, a sidewall, and the bottom surface of extending portion 121 of dielectric structure 121.

Figure 1E:
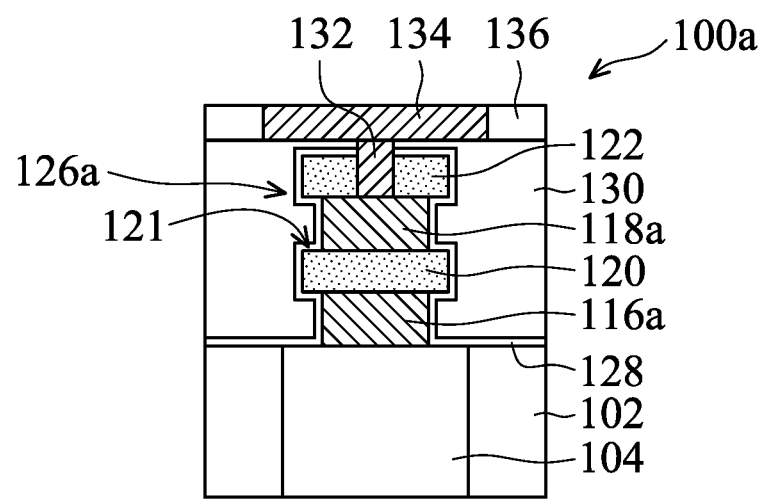

Next, an inter-metal dielectric (IMD) layer 130 is formed over etch stop layer 128, as shown in FIG. 1E in accordance with some embodiments. As described previously, extending portion 121 of dielectric structure 120 is exposed and extrudes from top electrode 118a and bottom electrode 116a after pull-back etching process 124. Therefore, after inter-metal dielectric layer 130 is formed, extending portion 121 of dielectric structure 120 further extends into inter-metal dielectric layer 130.

In some embodiments, inter-metal dielectric layer 130 includes multilayers made of multiple dielectric materials, such as a low dielectric constant or an extreme low dielectric constant (ELK) material. Examples of the dielectric materials may include, but are not limited to, oxide, $SiO_2$, borophosphosilicate glass (BPSG), tetraethyl orthosilicate (TEOS), spin-on glass (SOG), undoped silicate glass (USG), fluorinated silicate glass (FSG), high-density plasma (HDP) oxide, or plasma-enhanced TEOS (PETEOS). Inter-metal dielectric layer 130 may be formed by any applicable deposition process, such as CVD, and an chemical mechanical polishing (CMP) process may be performed after the deposition process.

After inter-metal dielectric layer 130 is formed, a via structure 132 is formed though inter-metal dielectric layer 130, etch stop layer 128, and hard mask structure 122, as shown in FIG. 1E in accordance with some embodiments. Via structure 132 is configured to electrically connect resistive random access memory structure 126a with other conductive features.

In some embodiments, via structure 132 is made of a highly-conductive metal, low-resistive metal, elemental metal, transition metal, or the like. Examples of conductive materials used to form via structure 132 may include, but are not limited to, copper (Cu), aluminum (Al), tungsten (W), titanium (Ti), gold (Au), cobalt (Co), or tantalum (Ta).

After via structure 132 is formed, a bit line structure 134 is formed in a dielectric layer 136 over inter-metal dielectric layer 130, as shown in FIG. 1E in accordance with some embodiments. In addition, bit line structure 134 is formed over via structure 132 and is electrically connected to top electrode 118a of resistive random access memory structure 126a through via structure 132.

In some embodiments, bit line structure 134 is made of a highly-conductive metal, low-resistive metal, elemental metal, transition metal, or the like. Examples of conductive materials used to form bit line structure 134 may include, but are not limited to, copper (Cu), aluminum (Al), tungsten (W), titanium (Ti), gold (Au), cobalt (Co), or tantalum (Ta).

Figure 2A:
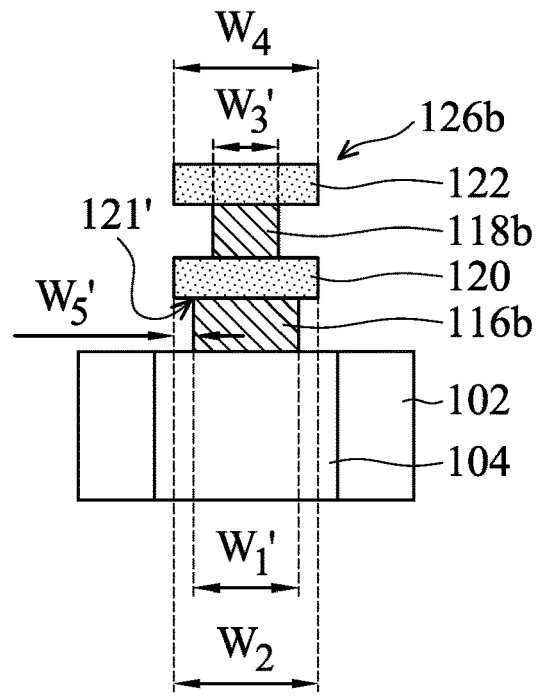
FIGS. 2A and 2B are cross-sectional representations of resistive random access memory structures in accordance with some embodiments.
Figure 2B:
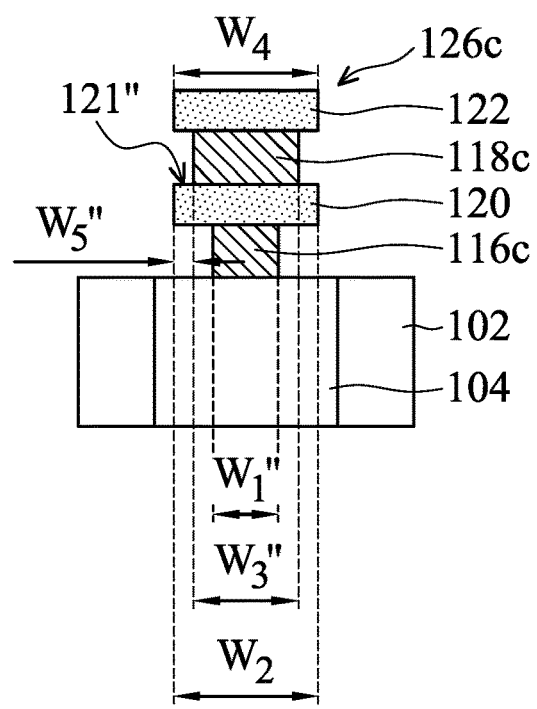

FIGS. 2A and 2B are cross-sectional representations of resistive random access memory structures 126b and 126c in accordance with some embodiments. Resistive random access memory structures 126b and 126c shown in FIGS. 2A and 2B are similar to resistive random access memory structures 126a shown in FIG. 1C, except the sizes of their top electrodes 118b and 118c and bottom electrodes 116b and 116c are different from those of resistive random access memory structures 126a. Methods and materials used to form resistive random access memory structures 126b and 126c may be similar to, or the same as, those used to form resistive random access memory structures 126a and may not be repeated herein.

More specifically, resistive random access memory structure 126b includes bottom electrode 116b, dielectric structure 120, and top electrode 118b, as shown in FIG. 2A in accordance with some embodiments. In addition, hard mask structure 122 is formed over top electrode 118b. As described previously, bottom electrode 116b, dielectric structure 120, top electrode 118b, and hard mask structure 122 may be formed by patterning bottom electrode layer 106, dielectric layer 108, top electrode layer 110, and hard mask layer 112 and performing pull-back etching process 124 to further etch top electrode 118b and bottom electrode 116b.

In some embodiments, top electrode 118b and bottom electrode 116b are made of different materials and therefore have different etching rate during pull-back etching process 124. In some embodiments, the etching rate of top electrode 118b is greater than the etching rate of bottom electrode 116b during pull-back etching process 124. Accordingly, the first width $W_1'$ of bottom electrode 116b is greater than the third width $W_3'$ of top electrode 118b after pull-back etching process 124 is performed. In some embodiments, the difference between the first width $W_1'$ of bottom electrode 116b and the third width $W_3'$ of top electrode 118b is in a range from about 1 nm to about 4 nm.

In addition, since top electrode 118b and bottom electrode 116b are etched during pull-back etching process 124 but dielectric structure 120 and hard mask structure 122 are not, the second width $W_2$ of dielectric structure 120 is greater than the first width $W_1'$ of bottom electrode 116b and the third width $W_3'$ of top electrode 118b in accordance with some embodiments.

Furthermore, the second width $W_2$ of dielectric structure 120 is substantially equal to the fourth width $W_4$ of hard mask structure 122 in accordance with some embodiments. Accordingly, the fourth width $W_4$ of hard mask structure 122 is also greater than the first width $W_1'$ of bottom electrode 116b and the third width $W_3'$ of top electrode 118b in accordance with some embodiments.

Similarly, after pull-back etching process 124, top electrode 118b and bottom electrode 116b are etched, and therefore extending portion 121 of dielectric structure 120 extrudes from top electrode 118b and bottom electrode 116b and extends into inter-metal dielectric layer 130 (not shown in FIG. 2A). In some embodiments, extending portion 121' of dielectric structure 120 has a fifth width $W_5'$, which is defined as the distance between an edge of the dielectric structure 120 and an edge to the bottom electrode 116b. In some embodiments, the fifth width $W_5'$ of extending portion 121' is in a range from about 1 nm to about 5 nm.

FIG. 2B is cross-sectional representation of resistive random access memory structures 126c in accordance with some embodiments. Resistive random access memory structure 126c includes bottom electrode 116c, dielectric structure 120, and top electrode 118c, as shown in FIG. 2B in accordance with some embodiments. In addition, hard mask structure 122 is formed over top electrode 118c.

As described previously, bottom electrode 116c, dielectric structure 120, top electrode 118c, and hard mask structure 122 may be formed by patterning bottom electrode layer 106, dielectric layer 108, top electrode layer 110, and hard mask layer 112 and performing pull-back etching process 124 to further etch top electrode 118c and bottom electrode 116c.

In some embodiments, top electrode 118c and bottom electrode 116c are made of different materials and therefore have different etching rate during pull-back etching process 124. In some embodiments, the etching rate of top electrode 118b is slower than the etching rate of bottom electrode 116c during pull-back etching process 124. Accordingly, the first width $W_1''$ of bottom electrode 116c is smaller than the third width $W_3''$ of top electrode 118c after pull-back etching process 124 is performed. In some embodiments, the difference between the first width $W_1''$ of bottom electrode 116c and the third width $W_3''$ of top electrode 118c is in a range from about 1 nm to about 4 nm.

In addition, since top electrode 118c and bottom electrode 116c are etched during pull-back etching process 124 but dielectric structure 120 and hard mask structure 122 are not, the second width $W_2$ of dielectric structure 120 is greater than the first width $W_1''$ of bottom electrode 116b and the third width $W_3''$ of top electrode 118b in accordance with some embodiments.

Furthermore, the second width $W_2$ of dielectric structure 120 is substantially equal to the fourth width $W_4$ of hard mask structure 122 in accordance with some embodiments. Accordingly, the fourth width $W_4$ of hard mask structure 122 is also greater than the first width $W_1''$ of bottom electrode 116c and the third width $W_3''$ of top electrode 118c in accordance with some embodiments.

Similarly, after pull-back etching process 124, top electrode 118c and bottom electrode 116c are etched, and therefore extending portion 121 of dielectric structure 120 extrudes from top electrode 118c and bottom electrode 116c and extends into inter-metal dielectric layer 130 (not shown in FIG. 2B). In some embodiments, extending portion 121'' of dielectric structure 120 has a fifth width $W_5''$, which is defined as the distance between an edge of the dielectric structure 120 and an edge to the top electrode 118c. In some embodiments, the fifth width $W_5''$ of extending portion 121'' is in a range from about 1 nm to about 5 nm.

Figure 3:
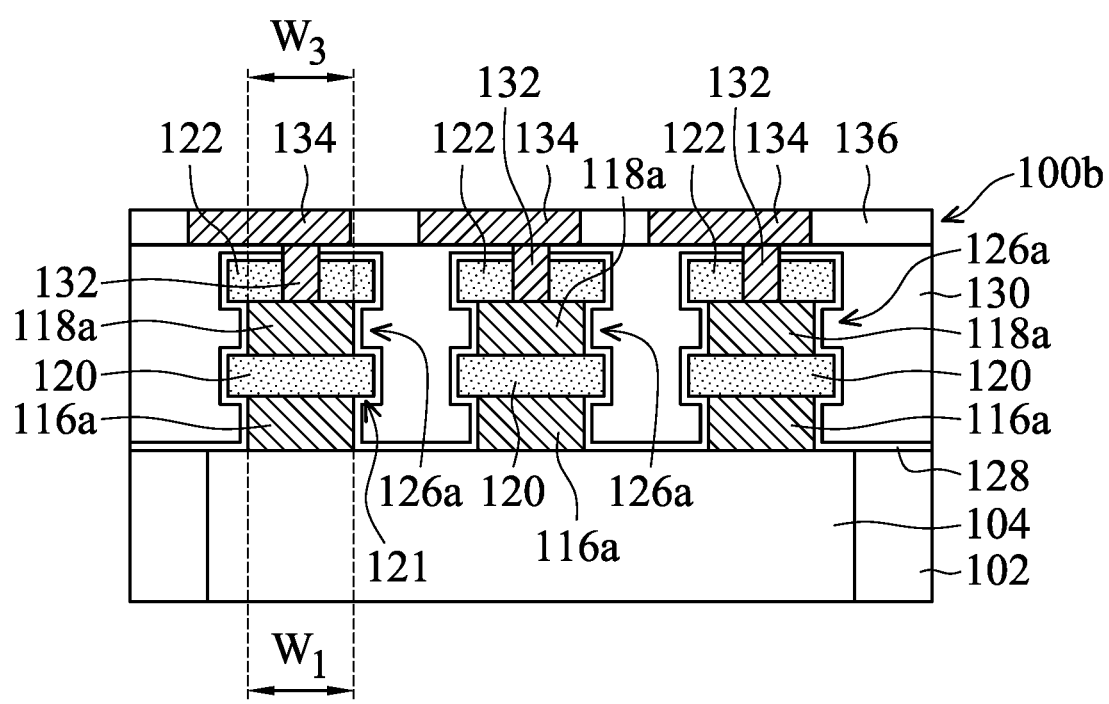
FIG. 3 is a cross-sectional representation of a semiconductor structure in accordance with some embodiments.

FIG. 3 is a cross-sectional representation of a semiconductor structure 100b in accordance with some embodiments. Methods and materials used to form semiconductor structure 100b shown in FIG. 3 may be similar to, or the same as, those used to form semiconductor structure 100a shown in FIG. 1E and may not be repeated herein.

More specifically, semiconductor structure 100b includes substrate 102 and device region 104 formed in substrate 102. In addition, a number of resistive random access memory structures 126a are formed in inter-metal dielectric layer 130 over substrate 102. Each resistive random access memory structure 126a includes bottom electrode 116a, dielectric structure 120, and top electrode 118a. In addition, hard mask structure 122 is formed over top electrode 118a, and etch stop layer 128 is formed over the top surface of hard mask structure 122 and the sidewalls of hard mask structure 122, top electrode 118a, dielectric structure 120, and bottom electrode 116a. Furthermore, via structure 132 is formed through hard mask structure 122 and is configured to connect resistive random access memory structure 126a to bit line structure 134 in accordance with some embodiments.

As shown in FIG. 3, more than one resistive random access memory structures 126a are formed over substrate 102. Therefore, after resistive random access memory structures 126a are formed, inter-metal dielectric layer 130 needs to be filled in the space between two adjacent resistive random access memory structures 126a. However, if the space between two adjacent resistive random access memory structures 126a is too small, the formation of inter-metal dielectric layer 130 may become challenging.

Accordingly, as described previously, pull-back etching process 124 is performed to etched bottom electrode 116a and top electrode 118a (not shown in FIG. 3, referring to FIG. 1C), and therefore the first width $W_1$ of bottom electrode 116a and the third width $W_3$ of top electrode 118a are reduced. That is, the distances between two adjacent bottom electrodes 116a and two adjacent top electrodes 118a increase. As a result, the process for forming inter-metal dielectric layer 130 around resistive random access memory structures 126a, especially between two adjacent resistive random access memory structures 126a, becomes easier.

It should be noted that, although resistive random access memory structures 126a are shown in semiconductor structure 100b in FIG. 3, they are merely examples for better understanding the disclosure. Resistive random access memory structures 126b and/or 126c shown in FIGS. 2A and 2B may alternatively or additionally be formed in semiconductor structure 100b, and the scope of the disclosure is not intended to be limited.

Figure 4:
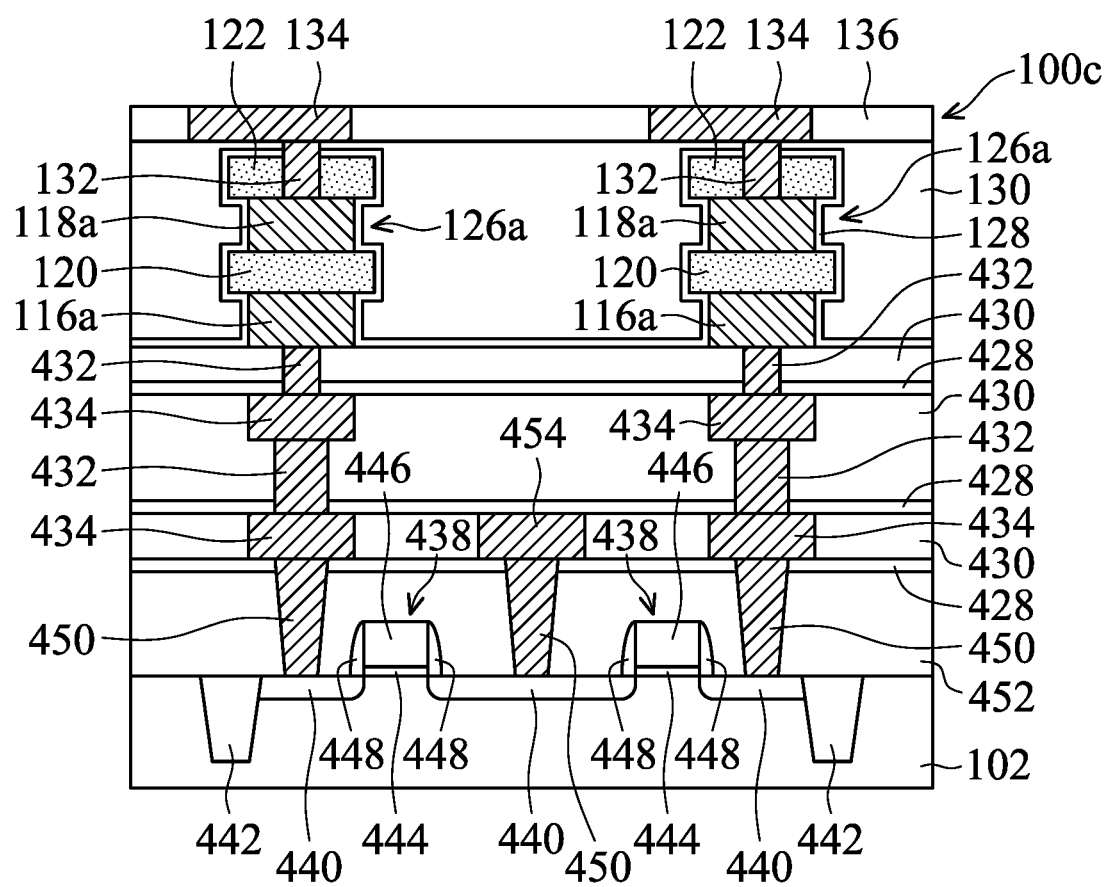
FIG. 4 is a cross-sectional representation of a semiconductor structure in accordance with some embodiments.

FIG. 4 is a cross-sectional representation of a semiconductor structure 100c in accordance with some embodiments. Methods and materials used to form semiconductor structure 100c in FIG. 4 may be similar to, or the same as, those used to form semiconductor structure 100a shown in FIG. 1E and may not be repeated herein.

As shown in FIG. 4, memory cell transistors 438 are formed over substrate 102, and source/drain structures 440 are formed in substrate 102 in accordance with some embodiments. In addition, shallow trench isolation structures 442 are formed in substrate 102 to separate various devices. In some embodiments, each memory cell transistor 438 includes a dielectric layer 444 and a word line structure 446 formed over dielectric layer 444. In addition, spacers 448 are formed on the sidewalls of word lines 446 in accordance with some embodiments.

In some embodiments, resistive random access memory structures 126a are connected to source/drain structures 440 through numbers of metal layers and contacts 450. In some embodiments, contacts 450 are formed through an inter-layer dielectric layer 452 and an etch stop layer 428 and are connected with source/drain structures 440. Memory cell transistors 438, source/drain structures 440, shallow trench isolation structures 442, contacts 450 may be formed by any applicable materials by any applicable processes, and the scope of the disclosure is not intended to be limited.

After contacts 450 are formed, metal layers are formed over inter-layer dielectric layer 452. The metal layers may include a number of conductive features, such as metal lines 434 and via structures 432, formed in an inter-metal dielectric layer 430 in accordance with some embodiments. In addition, etch stop layers 428 are formed between metal layers in accordance with some embodiments. In some embodiments, a source line structure 454 is formed over one of contacts 450 to electrically connect to one memory cell transistor 438.

Materials and methods used to form etch stop layers 428, inter-metal dielectric layer 430, via structures 432, and metal lines 434 may be similar to, or the same as, those used to form etch stop layers 128, inter-metal dielectric layer 130, via structures 432, and metal lines 434, respectively.

It should be noted that, although two sets of metal lines and via structures are shown in FIG. 4, the numbers of metal lines and via structures may be varied according to their application. For example, there may be one to five metal layers formed in a semiconductor structure to connect a memory cell transistor to a resistive random access memory structure.

After the metal layers are formed, resistive random access memory structures 126a are formed in inter-metal dielectric layer 130 over the metal layers. As described previously, each resistive random access memory structure 126a includes bottom electrode 116a, dielectric structure 120, and top electrode 118a. In addition, hard mask structure 122 is formed over top electrode 118a, and etch stop layer 128 is formed over the top surface of hard mask structure 122 and the sidewalls of hard mask structure 122, top electrode 118a, dielectric structure 120, and bottom electrode 116a. Furthermore, via structure 132 is formed through hard mask structure 122 and is configured to connect resistive random access memory structure 126a to bit line structure 134 in accordance with some embodiments.

It should be noted that, although resistive random access memory structures 126a are shown in semiconductor structure 100c in FIG. 4, they are merely examples for better understanding the disclosure. That is, resistive random access memory structures 126b and/or 126c shown in FIGS. 2A and 2B may alternatively or additionally be formed in semiconductor structure 100c, and the scope of the disclosure is not intended to be limited.

As described previously, bottom electrode layer 106, dielectric layer 108, top electrode layer 110, and hard mask layer 112 is patterned by etching process 114, which is a one-step cutting process in accordance with some embodiments. Therefore, no complicated masking and aligning processes are required, and the cost of patterning may be reduced.

In addition, after etching process 114, pull-back etching process 124 is further performed to etch the top electrode (e.g. top electrodes 118a, 118b, or 118c) and the bottom electrode (e.g. bottom electrodes 116a, 116b, or 116c) in accordance with some embodiments. By performing pull-back etching process 124, the risk of a short circuit may decrease.

More specifically, when a number of resistive random access memory structures are formed over the substrate (e.g. resistive random access memory structures 126a shown in FIG. 3), inter-metal dielectric layer 130 needs to be filled in the space between two adjacent resistive random access memory structures. However, if the distance between two resistive random access memory structures is too small, it may be difficult to completely fill in the space, and therefore voids may be formed. These voids may be filled with conductive material in a subsequent bit line structure forming process, and the risk of a short circuit increases.

Accordingly, pull-back etching process 124 is performed to prevent the formation of the voids formed in the space between two adjacent resistive random access memory structures. After pull-back etching process 124, the width of the bottom electrode (e.g. the first width $W_1$, $W_1'$, or $W_1''$) and the width of the top electrode (e.g. the third width $W_3$, $W_3'$, or $W_3''$) are reduced. Therefore, the distance between two adjacent resistive random access memory structures, such as resistive random access memory structures 126a1, 126b, or 126c, is increased. Accordingly, inter-metal dielectric layer 130 can be formed in the space between two adjacent resistive random access memory structures without forming voids. Therefore, the yield of the manufacturing process is improved.

Furthermore, the widths of the top electrode and the bottom electrode may be adjusted by pull-back etching process 124. More specifically, the top electrode and the bottom electrode may be made of the same or different materials, and the widths of the top electrode and the bottom electrode can be adjusted accordingly. For example, top electrode 118a and bottom electrode 116a are made of the same, or similar, material, and therefore they have the same, or similar, etching rate during pull-back etching process 124. Accordingly, the first width $W_1$ of bottom electrode 116a is substantially equal to the third width $W_3$ of top electrode 118a and is smaller than the second width $W_2$ of dielectric structure 120.

On the other hand, the top electrodes, such as top electrodes 118b and 118c, and the bottom electrode, such as bottom electrodes 116b and 116c, are made of different materials, and therefore they have different etching rates during pull-back etching process 124. Accordingly, the first width $W_1'$ and $W_1''$ are different from the third width $W_3'$ and $W_3''$ and are smaller than the second width $W_2$ of dielectric structure 120.

Moreover, after pull-back etching process 124 is performed, the top electrode, the dielectric structure, and the bottom electrode have different widths, and the resulting resistive random access memory structure has bumpy sidewalls. Therefore, ALD process is used to conformally form etch stop layer 128 over the bumpy sidewall in accordance with some embodiments.

In addition, hard mask structure 122 is formed over the top electrode in accordance with some embodiments. Hard mask structure 122 is configured to not only be a mask layer during etching process 114 but also to be a protection layer for the top electrode in subsequent processes. Accordingly, damage to the top electrode, such as oxidation of the top electrode, may be prevented.

Embodiments of a semiconductor structure and methods for forming the semiconductor structures are provided. The semiconductor structure includes a resistive random access memory structure, including a top electrode, a bottom electrode, and a dielectric structure formed between the top electrode and the bottom electrode. A pull-back etching process is performed to diminish the widths of the top electrode and the bottom electrode, such that an inter-metal dielectric layer can be formed in the space between two adjacent resistive random access memory structures without forming voids.

In some embodiments, a method for manufacturing a semiconductor structure is provided. The method for manufacturing a semiconductor structure includes forming a bottom electrode layer over a substrate and forming a dielectric layer over the bottom electrode layer. The method for manufacturing a semiconductor structure further includes forming a top electrode layer over the dielectric layer and patterning the bottom electrode layer, the dielectric layer, and the top electrode layer to form a dielectric structure between a bottom electrode and a top electrode. The method for manufacturing a semiconductor structure further includes etching the bottom electrode from a sidewall of the bottom electrode to partially expose a bottom surface of the dielectric structure.

In some embodiments, a method for manufacturing a semiconductor structure is provided. The method for manufacturing a semiconductor structure includes forming a bottom electrode layer over a substrate and forming a dielectric layer over the bottom electrode layer. The method for manufacturing a semiconductor structure further includes forming a top electrode layer over the dielectric layer and patterning the bottom electrode layer, the dielectric layer, and the top electrode layer to form a bottom electrode, a dielectric structure over the bottom electrode, and a top electrode over the dielectric structure. In addition, a sidewall of the bottom electrode, a sidewall of the dielectric structure, and a sidewall of the bottom electrode are substantially aligned. The method for manufacturing a semiconductor structure further includes recessing the bottom electrode and the top electrode, so that the dielectric structure becomes wider than the top electrode and the bottom electrode.

In some embodiments, a method for manufacturing a semiconductor structure is provided. The method for manufacturing a semiconductor structure includes forming a bottom electrode layer over a substrate and forming a dielectric layer over the bottom electrode layer. The method for manufacturing a semiconductor structure further includes forming a top electrode layer over the dielectric layer and patterning the bottom electrode layer, the dielectric layer, and the top electrode layer to form a dielectric structure between a bottom electrode and a top electrode. The method for manufacturing a semiconductor structure further includes etching the bottom electrode and the top electrode, so that an extending portion of the dielectric structure extrudes from the bottom electrode and the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a bottom electrode layer over a substrate;
   forming a dielectric layer over the bottom electrode layer;
   forming a top electrode layer over the dielectric layer;
   patterning the bottom electrode layer, the dielectric layer, and the top electrode layer to form a dielectric structure between a bottom electrode and a top electrode;
   etching the bottom electrode from a sidewall of the bottom electrode to partially expose a bottom surface of the dielectric structure; and
   forming an etch stop layer over the exposed bottom surface of the dielectric structure.

2. The method for manufacturing a semiconductor structure as claimed in claim 1, wherein the dielectric structure is wider than the bottom electrode after etching the bottom electrode from the sidewall of the bottom electrode.

3. The method for manufacturing a semiconductor structure as claimed in claim 2, further comprising:
    etching the top electrode from a sidewall of the top electrode to partially expose a top surface of the dielectric structure.

4. The method for manufacturing a semiconductor structure as claimed in claim 3, wherein the bottom electrode is wider than the top electrode after etching the top electrode from the sidewall of the top electrode.

5. The method for manufacturing a semiconductor structure as claimed in claim 1, wherein the top electrode is wider than the bottom electrode after etching the top electrode from the sidewall of the top electrode.

6. The method for manufacturing a semiconductor structure as claimed in claim 1, further comprising:
    forming a hard mask structure over the top electrode; and
    forming a via structure through the hard mask structure, wherein the via structure is in direct contact with the top electrode.

7. The method for manufacturing a semiconductor structure as claimed in claim 6, further comprising:
    forming an interlayer dielectric layer over the substrate, wherein a portion of the interlayer dielectric layer is sandwiched between the hard mask structure and the dielectric structure.

8. A method for manufacturing a semiconductor structure, comprising:
    forming a bottom electrode layer over a substrate;
    forming a dielectric layer over the bottom electrode layer;
    forming a top electrode layer over the dielectric layer;
    patterning the bottom electrode layer, the dielectric layer, and the top electrode layer to form a bottom electrode, a dielectric structure over the bottom electrode, and a top electrode over the dielectric structure, wherein a sidewall of the bottom electrode, a sidewall of the dielectric structure, and a sidewall of the bottom electrode are substantially aligned; and
    recessing the bottom electrode and the top electrode, so that the dielectric structure becomes wider than the top electrode and the bottom electrode, and the bottom electrode and the top electrode have different widths after etching the top electrode from the sidewall of the top electrode.

9. The method for manufacturing a semiconductor structure as claimed in claim 8, further comprising:
    conformally forming an etch stop layer on the top electrode, the dielectric structure, and the bottom electrode, wherein the etch stop layer directly covers a top surface, a sidewall, and a bottom surface of the dielectric structure.

10. The method for manufacturing a semiconductor structure as claimed in claim 8, further comprising:
    forming an etch stop layer on sidewalls of the top electrode, the dielectric structure, and the bottom electrode; and
    forming an interlayer dielectric layer on the etch stop layer,
    wherein a portion of the dielectric structure overlaps the interlayer dielectric layer.

11. The method for manufacturing a semiconductor structure as claimed in claim 8, wherein the sidewall of the bottom electrode, the sidewall of the top electrode, and the sidewall of the dielectric structure are not aligned with each other after recessing the bottom electrode and the top electrode.

12. The method for manufacturing a semiconductor structure as claimed in claim 8, further comprising:
    forming a hard mask structure over the top electrode;
    forming an etch stop layer on sidewalls of the top electrode, the dielectric structure, the bottom electrode, and a top surface of the hard mask structure; and
    forming an interlayer dielectric layer on the etch stop layer,
    wherein a bottom surface of the hard mask structure is in direct contact with the etch stop layer.

13. A method for manufacturing a semiconductor structure, comprising:
    forming a bottom electrode layer over a substrate;
    forming a dielectric layer over the bottom electrode layer;
    forming a top electrode layer over the dielectric layer;
    patterning the bottom electrode layer, the dielectric layer, and the top electrode layer to form a dielectric structure between a bottom electrode and a top electrode; and
    etching the bottom electrode and the top electrode by performing a wet etching process, so that an extending portion of the dielectric structure extrudes from the bottom electrode and the top electrode.

14. The method for manufacturing a semiconductor structure as claimed in claim 13, wherein an etching rate of the bottom electrode is different from an etching rate of the top electrode during the wet etching process.

15. The method for manufacturing a semiconductor structure as claimed in claim 13, wherein the etching process is performed at a temperature in a range from about 15° C. to about 80° C.

16. The method for manufacturing a semiconductor structure as claimed in claim 13, wherein the etching process comprises using a mixture of $NH_3$, $H_2O_2$, and $H_2O$.

17. The method for manufacturing a semiconductor structure as claimed in claim 13, further comprising:
    forming an etch stop layer over sidewalls of the top electrode, the dielectric structure, and the bottom electrode and a top surface and a bottom surface of the dielectric structure.

18. The method for manufacturing a semiconductor structure as claimed in claim 6, wherein the via structure is in direct contact with the hard mask structure.

19. The method for manufacturing a semiconductor structure as claimed in claim 12, further comprising:
    forming a via structure passing through the etch stop layer and through the hard mask structure.

* * * * *